(12) United States Patent
Amos

(10) Patent No.: US 7,738,877 B2
(45) Date of Patent: Jun. 15, 2010

(54) WIRELESS NETWORK MANAGEMENT WITH ANTENNA CONTROL

(75) Inventor: James A. Amos, North Canton, OH (US)

(73) Assignee: Cisco Technology, Inc., San Jose, CA (US)

( * ) Notice: Subject to any disclaimer, the term of this patent is extended or adjusted under 35 U.S.C. 154(b) by 1140 days.

(21) Appl. No.: 10/894,245

(22) Filed: Jul. 19, 2004

(65) Prior Publication Data
US 2006/0023648 A1   Feb. 2, 2006

(51) Int. Cl.
H04W 72/00   (2009.01)

(52) U.S. Cl. .............. 455/454; 455/450; 455/456.1; 370/328; 370/338; 370/310

(58) Field of Classification Search ............. 455/13.3, 455/13.4, 25, 19, 127.1, 127.2, 129, 454, 455/450, 456.1; 370/338, 328, 310
See application file for complete search history.

(56) References Cited

U.S. PATENT DOCUMENTS

| | | | |
|---|---|---|---|
| 5,491,715 A | 2/1996 | Flaxl | |
| 5,745,844 A | 4/1998 | Kromer et al. | |
| 5,987,062 A | 11/1999 | Engwer et al. | |
| 6,236,841 B1 | 5/2001 | Akiya | |
| 6,638,170 B1 | 10/2003 | Crumby | |
| 6,687,488 B2 | 2/2004 | Elder et al. | |
| 6,687,492 B1 | 2/2004 | Sugar et al. | |
| 6,788,731 B2 | 9/2004 | Kim et al. | |
| 6,804,498 B1 * | 10/2004 | Ball et al. | ........... 455/115.1 |
| 6,823,180 B2 | 11/2004 | Reed et al. | |
| 6,853,197 B1 | 2/2005 | McFarland et al. | |
| 6,862,433 B2 | 3/2005 | Callaway, Jr. | |
| 6,873,651 B2 | 3/2005 | Tesfai et al. | |
| 7,171,238 B2 | 1/2007 | Nicholson | |
| 2002/0090966 A1 | 7/2002 | Hansen et al. | |
| 2003/0129966 A1 | 7/2003 | Le Bars et al. | |
| 2004/0127247 A1 | 7/2004 | Reece et al. | |
| 2005/0148368 A1 * | 7/2005 | Scheinert et al. | ........... 455/561 |

* cited by examiner

*Primary Examiner*—Ajit Patel
*Assistant Examiner*—Khai M Nguyen
(74) *Attorney, Agent, or Firm*—Tucker Ellis & West LLP

(57) ABSTRACT

A method and apparatus for managing a wireless local area network are disclosed. The network includes one or more wireless access points, each including a radio frequency assembly having a variable power output, and an antenna assembly for transmitting and receiving wireless signals. A microcontroller is included for sending a transmission characteristics signal to the wireless local area network. A network manager is included for receiving the transmission characteristics signal and selectively controlling the variable power output of the radio frequency assembly to a predetermined power level.

25 Claims, 5 Drawing Sheets

WIRELESS NETWORK MANAGEMENT WITH ANTENNA CONTROL

BACKGROUND OF THE INVENTION

The present system is generally directed to the field of wireless communications. The present system has particular applicability in a wireless access point (AP) or wireless bridge (BR) of the type used in a wireless local area network (WLAN) and employing an antenna system for exchanging wireless signals.

As shown in FIG. 1, a managed wireless local area network (WLAN) 10 includes a network backbone 12, preferably an Ethernet network, and at least one wireless access point (AP) 14 (e.g., AP1, AP2 . . . APN, as indicated). Each access point 14 wirelessly communicates over radio frequencies with a plurality of wireless clients 16. The operation and performance of the wireless local area network 10 is typically handled by a network manager or network management entity (NME) 18. A network manager or network management entity 18 is used to calculate and determine a suitable coverage area that an access point can provide as will be shown and described hereinafter.

Management of an access point is also useful in instances where an access point is used in a stand alone configuration or mode and still needs to meet radiated power limitations imposed by regulation. Use of the present invention allows an access point to maximize output power with a particular antenna while complying with the regulations.

Referring also to FIG. 2, a typical layout for wireless local area network 10 is based on a floor plan 20 of an operating area, e.g. an office or other work area. Each access point 14 has a range, so as to establish a respective coverage area 22 associated with each access point 14. The coverage areas 22 can be selected to cover the anticipated wireless throughput requirements in a given area based on the expected locations of wireless clients within the areas 22. The size of the coverage areas 22 are based on the transmitted power, the antenna gain, and the various obstructions, e.g., metal building components that would interfere with the wireless signals. In the typical management of wireless local area network 10, the access points 14 are configured to transmit at the highest power possible, i.e., powered up to high power, and signals are exchanged. The network manager or network management entity 18 observes the strength of the received signals and uses this information to generate a "path loss vector," which is an indication of the amount of attenuation in the signal between access points 14. The network manager or network management entity 18 uses this information to calculate the actual range of each access point 14, in order to determine a practical coverage area 22 for each access point 14 that services wireless clients 16 without interfering with other access points. The path loss $P_L$ can be determined by the following expression:

$$P_L = P_{RAD} - RSSI \text{ where}$$

$P_{RAD}$ equals radiated power (measured in dBm); and
RSSI equals a received signal strength indicator (measured in dBm).

The radiated power $P_{RAD}$ itself equals the transmitter power $P_{Tx}$ plus the antenna gain $G_{ANT}$ so that the path loss can be expressed as:

$$P_L = P_{Tx} + G_{ANT} - RSSI$$

However, it can be difficult in practice to isolate these variables and thereby properly establish coverage areas 22. For instance, various access points have different power-output capabilities and different external antennas have different antenna gains. Further, an antenna may be connected to a respective access point using a long coaxial cable. Consequently, there may be a power loss associated with the cable length that complicates the path loss calculation. As a result of these variables, a network manager, e.g., network management entity 18, can only make assumptions about antenna gain from the measured quantities. These factors can also vary across different wireless channels and/or bands, thereby making it difficult to determine suitable coverage areas for a set of access points in a wireless local area network.

In previous systems, the antenna gain is entered manually and the antenna is considered to be an omni-directional antenna. A dipole, for example, is an omni-directional antenna with 2.2 dBi of antenna gain. Other types of omni-directional antenna can provide additional antenna gains, but all share a round radiation pattern when looking at a floor plan or map, such as floor 20 shown in FIG. 2. Either a bad assumption or incorrect knowledge of the antenna gain and/or type will cause invalid results by the network management entity 18 regarding network coverage.

Other types of antennas provide additional gain but with different types of radiation patterns. For example, "Yagi" antennas have higher gain and offer a narrow, long radiation pattern. These are typically used for bridging applications, but are also used here as an example. If an access point were to have a Yagi antenna installed, previous systems would not identify the antenna as such, and would likely assume the Yagi antenna to be a omni-directional antenna having less antenna gain.

Moreover, in previous systems, signal strength is simply measured and reported to the network manager, and only inferences can be made about the antenna gain. This uncertainty in antenna gain contributes to the problems of locating clients within a wireless local area network. In a typical system, the location of a client is based on knowing the relative signal strength of the client at different access points. But if the actual antenna gain is different than that assumed, the values used in the calculations will be different than the actual values, and, thus, the path loss calculation will not be correct, resulting in faulty distance determinations. This results in uncertainty in locating clients, since a client's location can only be estimated within an area of potential locations. Also, since variance in signal strength may be the result of other environmental factors, such as internal reflections from metallic construction elements in the building, this contributes further to the uncertainty.

Additionally, current wireless local area network capabilities create problems from a regulatory standpoint. The Federal Communications Commission (FCC) and other national regulatory agencies worldwide place various restrictions on transmitting radio antennas, such as establishing maximum radiated power limits. For wireless local area network devices, the transmit power is limited to 27 dBm or about 500 milliwatts (mW) without the support of transmit power control (TPC), which is part of the European Union (EU) European Telecommunications Standards Institute (ETSI) Broad Band Radio Access Network (BRAN) regulations. Generally, transmit power control requires that an access point transmit at the lowest power possible. These power limitations are necessary to avoid interference with other sources, particularly military radar, that share the same 5 GHz band with the wireless local area network channels in accordance with the Institute of Electrical and Electronics Engineers (IEEE) 802.11(a) protocol. However, this requirement is easily circumvented since it possible to obtain "off the shelf" external antennas that have higher antenna gains than can permissibly be used with a particular access point. For example, it is possible to operate a 20 dBm antenna with a 17 dBm access point for an illegal output of 37 dBm.

Previous-type solutions are known to the problem of connecting non-compliant antennas to access points. For example, it is known to use a "reverse TNC connector." This type of connector was originally developed for wireless local area network use as a unique connector that was not readily available, thus preventing non-compliant antennas from being used with wireless local area network products. However, after-market adapters are now available that allow non-compliant antennas to be used.

SUMMARY OF THE INVENTION

The difficulties and drawbacks of previous-type systems are overcome by the present apparatus and method for managing a wireless local area network. In accordance with an aspect of the present invention, there is disclosed herein a managed wireless local area network including at least one wireless access point comprising a radio frequency assembly having a variable power output and an antenna assembly for transmitting and receiving wireless signals. The managed wireless local area network further includes a microcontroller for sending a transmission characteristics signal associated with the antenna assembly.

In accordance with another aspect of the present invention, there is disclosed herein a wireless access point including a radio frequency assembly having a variable power output, for exchanging signals with a wireless client, an antenna assembly, cooperating with the radio frequency assembly, for transmitting and receiving wireless signals to be exchanged with the wireless client, and a microcontroller for sending a transmission characteristics signal to a network.

In accordance with yet another aspect of the present invention, there is disclosed herein an antenna assembly for use with a wireless access point including an antenna microcontroller for sending a transmission characteristic signal.

In accordance with still another aspect of the present invention, there is disclosed herein a method of network management includes polling a wireless access point and determining transmission characteristics of the wireless access point in response to the poll.

In accordance with yet another aspect of the present invention, there is disclosed herein a computer-readable medium of instructions for managing a network includes means for polling a wireless access point and means for determining transmission characteristics of the wireless access point in response to the poll.

As will be realized, the invention is capable of other and different embodiments and its several details are capable of modifications in various respects, all without departing from the invention. Accordingly, the drawing and description are to be regarded as illustrative and not restrictive.

DETAILED DESCRIPTION OF THE EMBODIMENTS

The present managed wireless local area network includes a network backbone that connects a number of wireless access points, for exchanging wireless telecommunications signals with wireless clients in the radio frequency (RF) band of the electromagnetic spectrum. The wireless access points each include an antenna assembly for transmitting and receiving signals at radio frequencies. In the preferred embodiment, the present system would communicate over one or both of the 2.4 and 5 Gigahertz (GHz) wireless bands, in accordance with the Institute of Electrical and Electronics Engineers (IEEE) 802.11 protocols. Of course, it should be appreciated that the present embodiments could be used with any wireless communication device, operating under any wireless band, including large communications stations and small, hand-held units, all without departing from the scope of the invention.

Figure 1:
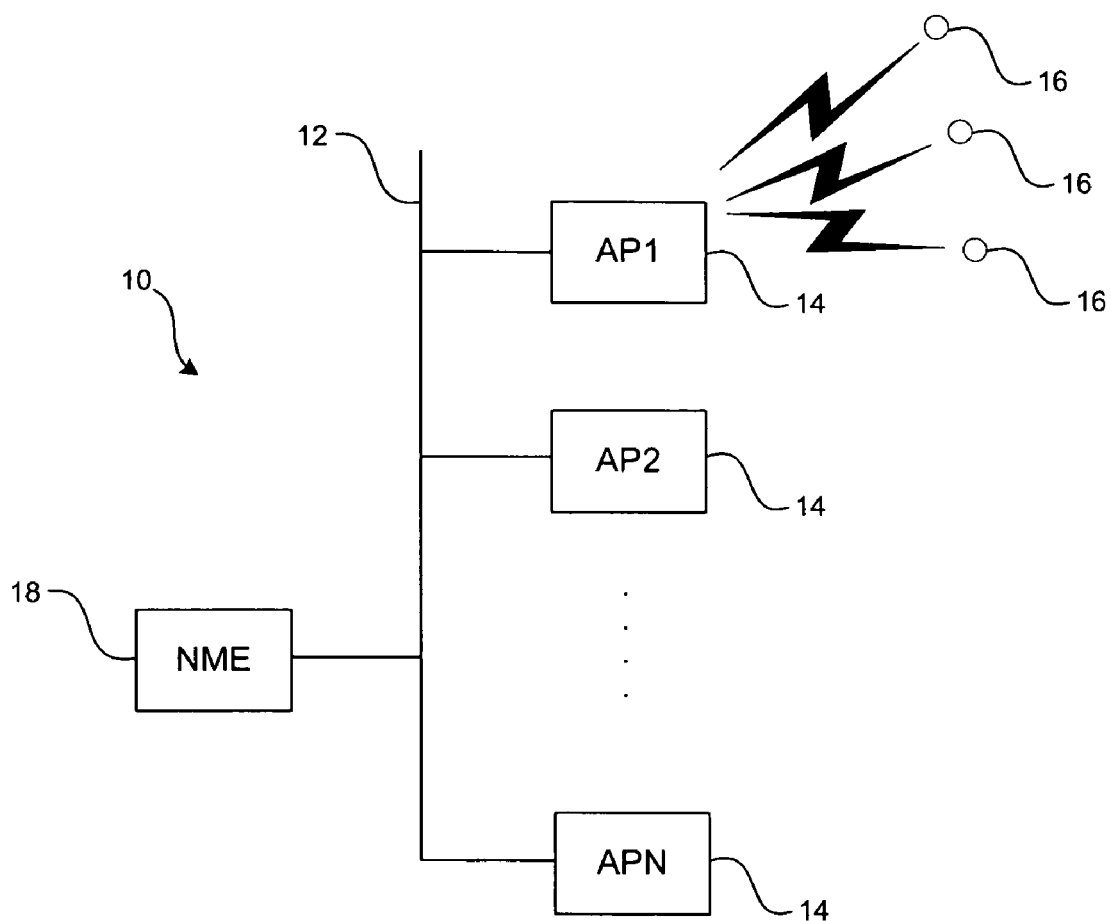
FIG. 1 is a schematic diagram representing the structure of a common wireless local area network as could also be implemented in accordance with the present system.
Figure 2:
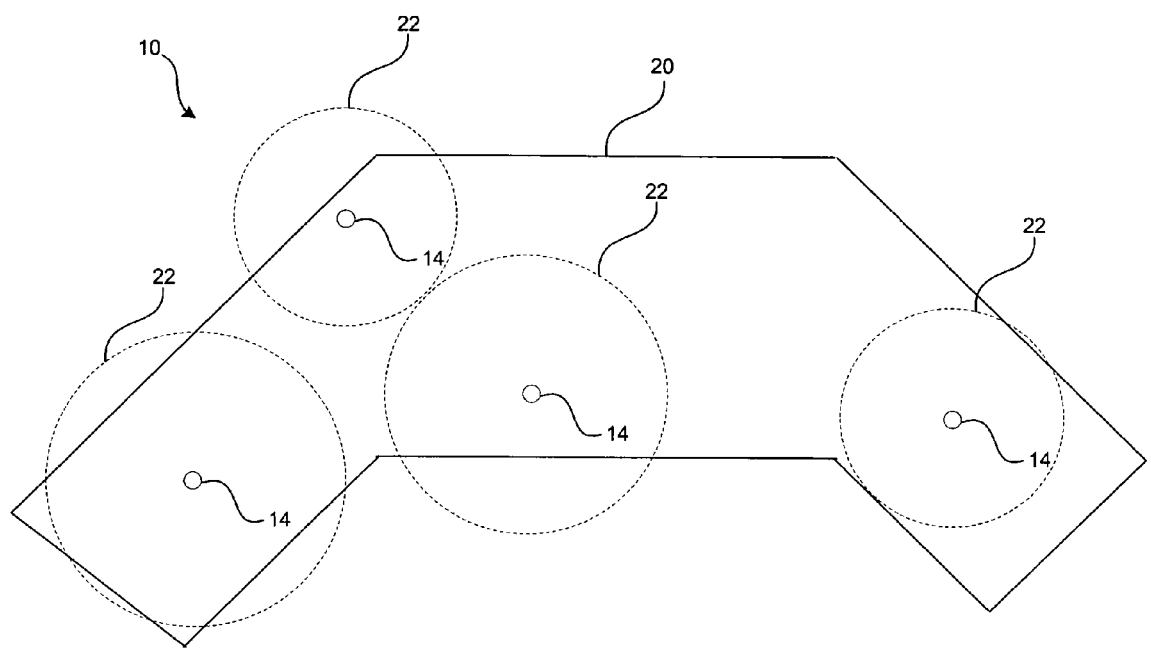
FIG. 2 is a plan view illustrating the layout of a wireless local area network as could also be implemented in accordance with the present system.
Figure 3:
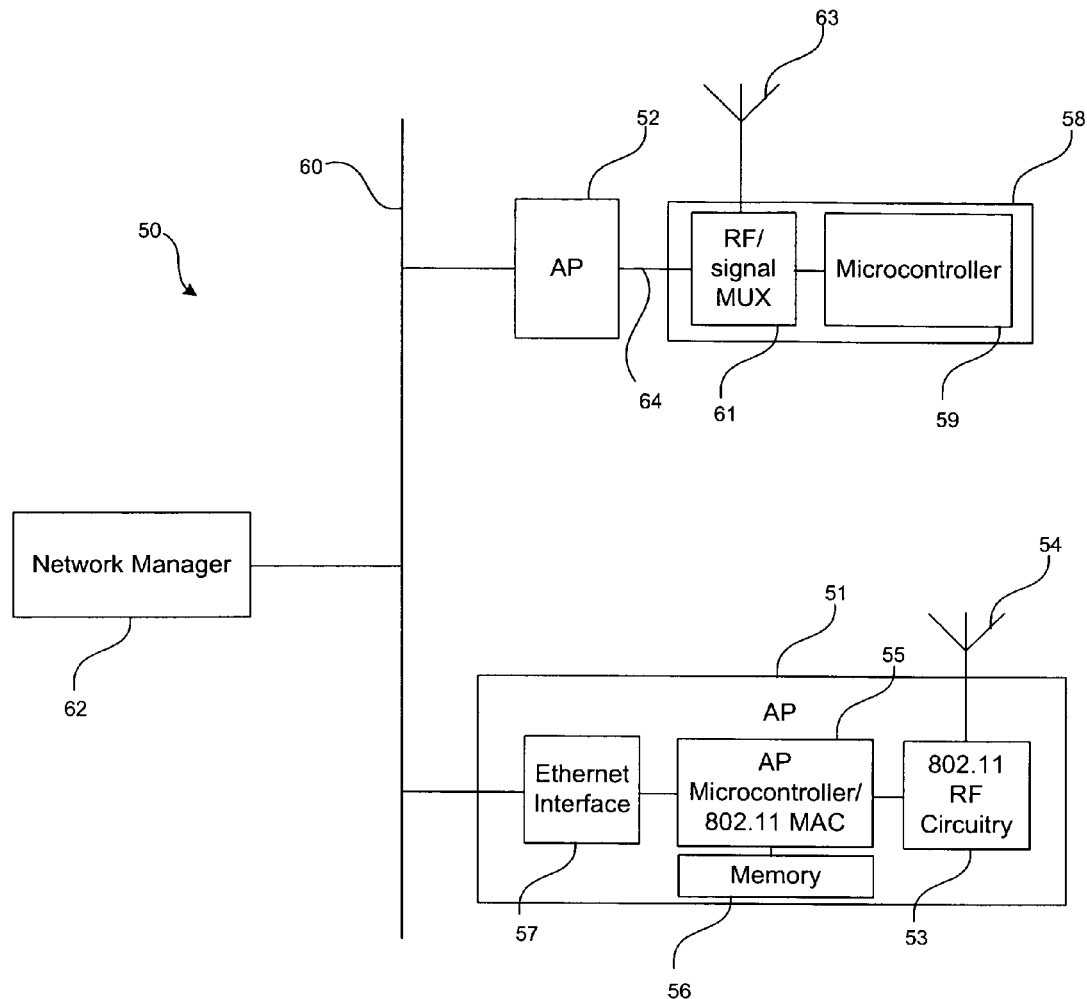
FIG. 3 is a schematic diagram representing the structure of a wireless network in accordance with the present embodiments.

As shown in FIG. 3, the present system includes a managed wireless local area network 50 including one or more wireless access points 51, 52. In accordance with one aspect of the present invention, a wireless access point 51 includes 802.11 radio frequency (RF) circuitry or, more generally, a radio frequency assembly 53 having a variable power output, for exchanging signals with a wireless client, an antenna assembly 54, cooperating with the radio frequency assembly 53, for transmitting and receiving wireless signals to be exchanged with the wireless client, and an access point microcontroller or 802.11 media access controller (MAC) 55 for sending a transmission characteristics signal to the network 50. Access point 51 further advantageously includes a memory 56 for storing data, e.g., transmission characteristics, and an Ethernet interface 57 for interfacing with network backbone 60, which can be an Ethernet network. It should be appreciated that the radio frequency assembly 53 preferably includes a physical layer (PHY) controller to handle the wireless-to-network signal conversion. Moreover, access point microcontroller or 802.11 media access controller (MAC) 55 establishes suitable protocol changes.

In accordance with another aspect of the present invention, an antenna assembly 58 for use with a wireless access point 52 includes an antenna microcontroller 59 for sending a transmission characteristic signal. Antenna assembly 58 further includes a radio frequency signal multiplexer 61 for coupling with access point 52 and one or more antenna elements 63. More specifically, a coaxial cable 64 may be used to couple antenna assembly 58 to access point 52.

Thus, either an access point microcontroller 55 or an antenna assembly microcontroller 59 is provided for sending a "transmission characteristics" signal to the wireless local area network 50. A network manager 62 is provided for commanding the microcontrollers 55, 59 to send their information. The network manager 62 receives the transmission characteristics signal and selectively controls the variable power output of the access points 51, 52 or, more specifically, a radio frequency assembly 53 to a predetermined power level in response thereto. For example, if a radiated power level of 27 dBm is desired, and antenna assemblies 54, 58 having an antenna gain of 17 dBm are used, the access points 51, 52 will automatically adjust their power output to 10 dBm in response thereto. In this way, the access points 51, 52 transmit a suitable amount of power so as to establish the desired coverage area 22 and comply with radiant power regulations.

Thus, in one embodiment, an access point 51 includes a microcontroller 55 and an antenna assembly 54, while in another embodiment, a microcontroller 59 is included as part of an antenna assembly 58. However, a microcontroller can also be a discrete network component, without departing from the scope of the present invention.

Irrespective of whether a microcontroller 55, 59 is part of an access point 51 or an antenna assembly 58, respectively, the access points 51, 52 report the transmission characteristics whenever they are polled by the network manager 62. The access point 52 polls and controls the antenna assembly 58 as needed. Thus, the network manager 62 does not need to know the difference between a connectorized access point 52 with a remote antenna assembly 58 including a microcontroller 59 and an access point 51 including an antenna assembly 54.

Also, from a network management point of view, the access point location 52 is where the antenna assembly 58 is for purposes of range calculations and access point coverage area 22. For example, an antenna assembly 58 can be as much as 300 feet away from an access point 52, e.g., coaxial cable 64 is 300 feet long. Further, the antenna assembly 58 can be outdoors with the remainder of the access point 52, the network manager, etc. being indoors. Other access points 51, 52 can likewise be either indoors or outdoors.

For example, and in a preferred embodiment, a Microchip PIC12F629 is used as microcontroller 59. The PIC12F629 is a readily available off-the-shelf microcontroller having 6 general purpose input/output (GPIO) ports, a universal asynchronous receiver/transmitter (UART), 128 bytes of electrically erasable programmable read-only memory (EEPROM), program memory, and random access memory (RAM). Thus, the PIC12F629 provides the hardware required for identification, e.g., transmission characteristics, and communications functions. In other embodiments, additional functions can be required, and, thus, additional resources and/or another part may be required.

In operation, the microcontroller 55, 59 sends a "transmission characteristics" signal representative of a desired property or parameter of the respective antenna assembly 54, 58 so as to allow the network manager 62 to vary the power output level of the respective access point 51, 52 in response thereto. These properties and parameters include, but are not limited to, a predetermined antenna gain, or an identifying characteristic of the respective antenna assembly, such as a product model number. For example, the properties and parameters can include antenna information such as antenna type (e.g., dipole, omni, patch, etc.), gain, serial number, part number, date of manufacturer, etc. In this respect, the microcontroller 55, 59 can include an electronic memory element for reading out preprogrammed antenna characteristics to the network manager 62.

Moreover, an error checking protocol can be implemented. In an error checking protocol, each end, i.e., the microcontroller 55, 59, the access point 51, 52, and/or the network manager 62, will echo back, transmitter to sender, all received bytes. If the byte received back is different from the one that was sent, an error code is transmitted, for example, 0xff, followed by the retransmission of the character.

Alternatively, when used with a dual band antenna, a microcontroller 55, 59 can be used to select an antenna band, e.g., 2.4 or 5 Gigahertz (GHz), instead of using multiple antennas or tuning. Moreover, when selecting bands, transmission characteristics can be updated accordingly. A microcontroller 55, 59 can also include a power sensor for making an output power measurement, either at the antenna, or upstream thereof. For example, in this way, the microcontroller 59 can measure a power loss that may occur along a coaxial cable 64 connecting an antenna assembly 58. The microcontroller 58 can also include a sensor or memory element, respectively, alone or in combination, for either measuring or reporting the operational frequency band of the antenna assembly 54, 58, since radiated power may vary as a function of frequency. The microcontroller 55, 59 can also be used to steer an antenna array or for pattern control. The microcontroller 55, 59 can also include a compass and inclinometer used to detect the orientation of the antenna assembly 54, 58. For example, in the case of an antenna having gain, this can be used to direct the radiation pattern. Similarly, the microcontroller 55, 59 can include environmental sensors, such as for example, moisture and temperature sensors.

The present embodiments include a method of network management, which can be implemented through hardware or through a software computer program product. The network manager 62 polls the wireless access points 51, 52 to determine their transmission characteristics. Each wireless access point 51, 52 replies, reporting its transmission characteristics, e.g. its specified antenna gain. The network manager 62 uses the reported value of antenna gain in an algorithm for calculating the path loss, and hence the coverage area. The network manager 62 is then able to control the operational parameters of each access point 51, 52, based on the transmission characteristics, so as to establish a predetermined coverage area for each access point 51, 52, and thence the entire wireless local area network 50. In the event that an external antenna is connected with a long coaxial cable (e.g., 150 feet) with the attendant power losses, the transmission characteristics can include a measured power output, e.g. from a power sensor. This value would be used in the algorithm to calculate radiated power, and the output power of the access point 52 would be increased accordingly.

The present network manager 62 may also read out transmission characteristics such as channel frequency bands of various access points 51, 52. For example, some antenna assemblies may operate on channels in the 2.4 Gigahertz band established under the Institute of Electrical and Electronics Engineers 802.11(b) and (g) protocols and on channels in the 5 Gigahertz band in accordance with the 802.11(a) protocol. The coverage areas of those access points may not necessarily be same, depending on the frequency of use, so the size of the coverage areas may need to be adjusted accordingly. Thus, the present system can also be used with a multiband antenna assembly, where the network manager 62 can control the access point operation by adjusting power output within a band or across bands.

As mentioned, the present transmission characteristics can also include identifying characteristics associated with the antenna assembly 54, 58. For example, the identifying characteristics can include a product model number. This information can be referenced by the network manager 62 to find the associated antenna gain and frequency band for that model number. As a further benefit, this information allows the network manager 62 to control the type of antennas used with an access point 52. The network manager 62 can instruct the microcontroller 59 to lock out or shut down an access point 52 if a non-compliant antenna is used. This allows proprietary control over the external antennas assemblies 58 that can be used with the access point 52. For example, a given manufacturer may stipulate that only their antenna products may be used with their access points, thereby precluding the use of competitors' antennas. Further, if the network manager 62 cannot read antenna gain, it can automatically switch off or switch to a minimal power mode, e.g. 0 dBm, so as to insure compliance with regulations and uniformity of product. The microcontroller 59 can also include an encryption code or other anti-tampering feature to guard against "aftermarket" devices or other attempts to circumvent antenna control by the network manager 62.

The present system allows different models of external antenna assemblies 58 to be used with various types of wireless access points 52. More specifically, the present embodiments allow the use of antenna assemblies 58 having diverse characteristics, including gain, radiation pattern, etc., and with the properties and parameters available therefrom, the network manager 62 can build a suitable coverage model of the entire wireless local area network 50. Such a coverage model would allow the calculation of power settings for a number of access points 52 to insure that all areas in the network 50 receive coverage. The present system also allows each access point 51, 52 to operate at the minimum power necessary to provide adequate coverage thereby minimizing interference for large installations where hundreds of access points may be in service. The present embodiments are also applicable to access points having integrated antennas that are not removable, since the encoded transmission characteristics of such antennas contribute to the overall information available via the network.

With knowledge of the transmission characteristics for each antenna assembly 54, 58 the network manager 62 can determine the respective coverage area. The network manager 62 can calculate the associated path loss ($P_L$), while still receiving a suitable data rate for a signal. For instance, an 802.11(a) or (g) system provides a throughput of about 15-25 Megabytes per second, while older systems provide about 5 or 6 Megabytes per second. Higher throughput rates are becoming more desirable. For example, a 54 Megabyte (MB) wireless link requires a received signal strength indication (RSSI) of −64 dBm. Using the path loss expression:

$$P_L = P_{TX} + G_{ANT} - RSSI$$

If the network manager 62 knows the transmitted power $P_{TX}$ and the antenna gain $G_{ANT}$, and if an access point 52 needs a received signal strength indication (RSSI) greater than or equal to −64 dBm, the path loss $P_L$ can be determined. This information is useful during the installation of a network since it allows installers to determine the number of access points required for an area based on a desired data rate or throughput.

By providing knowledge of antenna gain and other transmission characteristics, the present network manager 62 also allows more precise location of client position, since precise knowledge of system variables reduces the uncertainty of client position within the network. In the preferred embodiment, the network manager 62 can be incorporated into an existing network management system, such as the Wireless LAN Solution Engine (WLSE) sold by Cisco Systems of 170 West Tasman Drive, San Jose, Calif. Alternatively, the various functions of the network manager 62 can be incorporated into one or more access points, servers or other network components, or can be distributed throughout multiple network components.

In the preferred embodiment, the present network manager 62 is used to adjust the output power of a radio frequency assembly 53 to thereby vary the radius of a circular coverage area concentric with an omni-directional antenna assembly 54 associated with a respective access point 51. However, further alternate embodiments are contemplated in which the respective access point 51 incorporates directional antennas. As is known, phased antenna arrays such as "Yagi" antennas can be used to create antenna coverage areas having high gain in a selected direction and very low gain in other directions, so as to communicate with wireless clients in a particular direction and isolate all other signals. A directional antenna assembly 54 incorporating an antenna array is formed of a plurality of antenna elements. Signals are respectively fed into each antenna element with predetermined phase differences such that constructive interference results in a predetermined transmission direction, and destructive interference results in all other directions. The phase can also be varied so as to vary the directional signal vector, resulting in a "steerable" antenna that can selectively "point" at different clients. The present microcontrollers 55, 59 and network manager 62 can provide precise knowledge of system variables such as antenna gain and direction, thereby enabling precise control of the phase differences required for directional antenna control, in this way improving the performance of a directional antenna system. It is of course appreciated that other types of directional antennas could be similarly used, such as parabolic dishes, corner reflectors, and helical antennas, all without departing from the invention. Thus, antenna direction can be another transmission characteristic of the antenna assembly 58 that can be queried by the network manager 62 and is used to plot coverage areas in wireless local area network 50.

Figure 4:
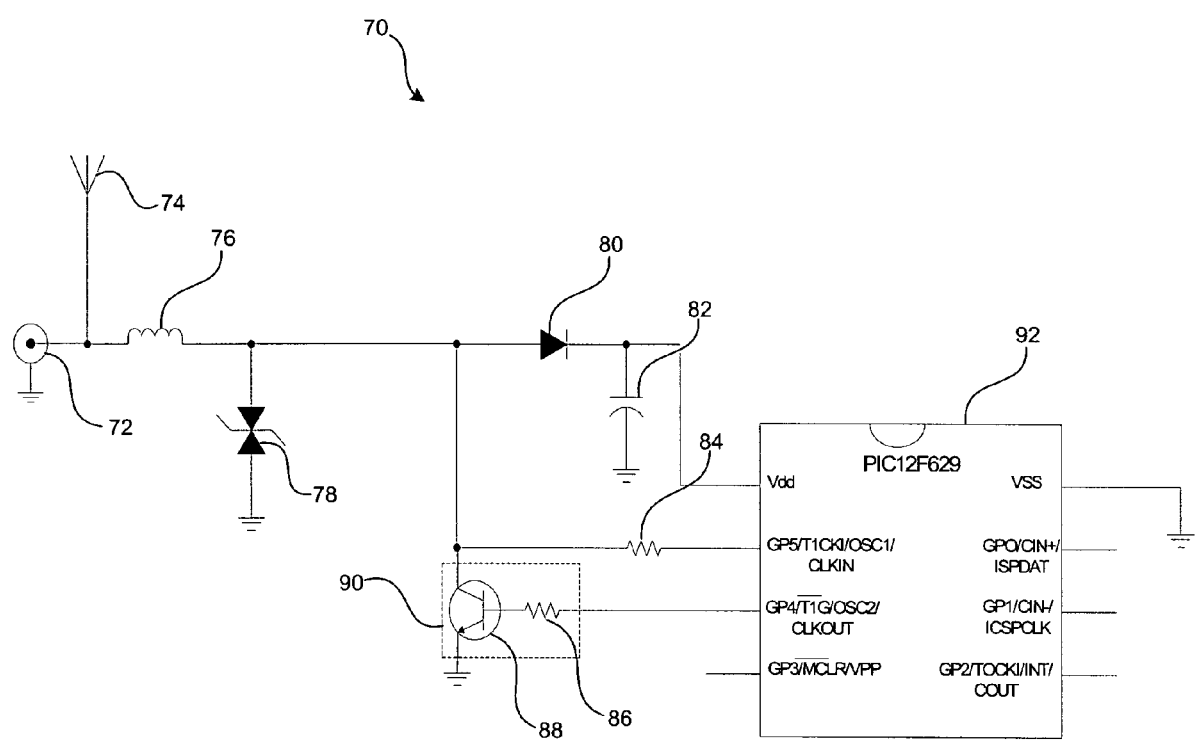
FIG. 4 is a schematic diagram of an antenna in accordance with the present system.

Referring to FIG. 4, a schematic diagram of an antenna assembly in accordance with the present system is shown. Antenna assembly 70 includes input connector 72, antenna element 74, choke, coil, or inductor 76, transient voltage suppressor 78, diode 80, capacitor 82, resistors 84 and 86, transistor 88, and microcontroller 92. Microcontroller 92 is preferably a PIC12F629 as previously described. Resistor 86 and transistor 88 comprise a reset circuit 90, and along with resistor 84 provide the ability to reset the microcontroller 92. Diode 80 and capacitor 82 provide a power feed for microcontroller 92, while inductor 76 provides high frequency isolation for microcontroller 92. Transient voltage suppressor 76 protects the microcontroller 92 from any energy strikes to antenna element 74. Input connector 72 facilitates connection of a coaxial cable to antenna assembly 70. In other embodiments, voltage and reset control can be provided external to antenna assembly 70.

In operation, American Standard Code for Information Interchange (ASCII) code is used to query data, e.g., a transmission characteristics signal representative of a desired property or parameter, from antenna assembly 70 using a coaxial cable coupled to input connector 72, such as, for example, at a 4800 baud rate. Generally, antenna assembly 70 works with low loss coaxial cables up to 150 feet in length. However, longer cables may be used depending on the bit rate. Such a query is performed on a "listen before talk" basis on the coaxial cable coupled to input connector 72. Thus, all signals, i.e., power, data, and radio frequency signals, are sent down the coaxial cable. Although these communications are one-way, that is, in the form of querying data from microcontroller 92, such communication can also be two-way, allowing data to also be written to microcontroller 92.

For example, a plug and play command set comprises control requirements and status requirements. Control requirements includes set/clear general purpose input/outputs, e.g., bit set and clear, and set/clear ports, e.g., byte set and clear. Status requirements include reading general purpose input/outputs such as bit and byte reads. Commands can include, but are not limited to, reading an inclination from an inclinometer, voltage standing wave ratio (VSWR), power, analog voltage, direction from a compass, and setting an analog voltage. A plug and play command set can also include erasable programmable read-only memory access including commands for a write, read, erase, etc. An erasable programmable read-only memory can also include a protected range written at the factory that is not accessible with these commands. Plug and play information available from memory can include antenna type, antenna gain, antenna diversity, and antenna sectored. For example, for antenna type, dipole, omni, patch, array, Yagi, and parabolic dish antennas can be represented by 0, 1, 2, 3, 4, 5, respectively. Further, antenna gain can be from 0 to 63 dBm, for example. Commands for an antenna part number, revision number, serial number, and manufacturing date can also be suitably included.

Figure 5:
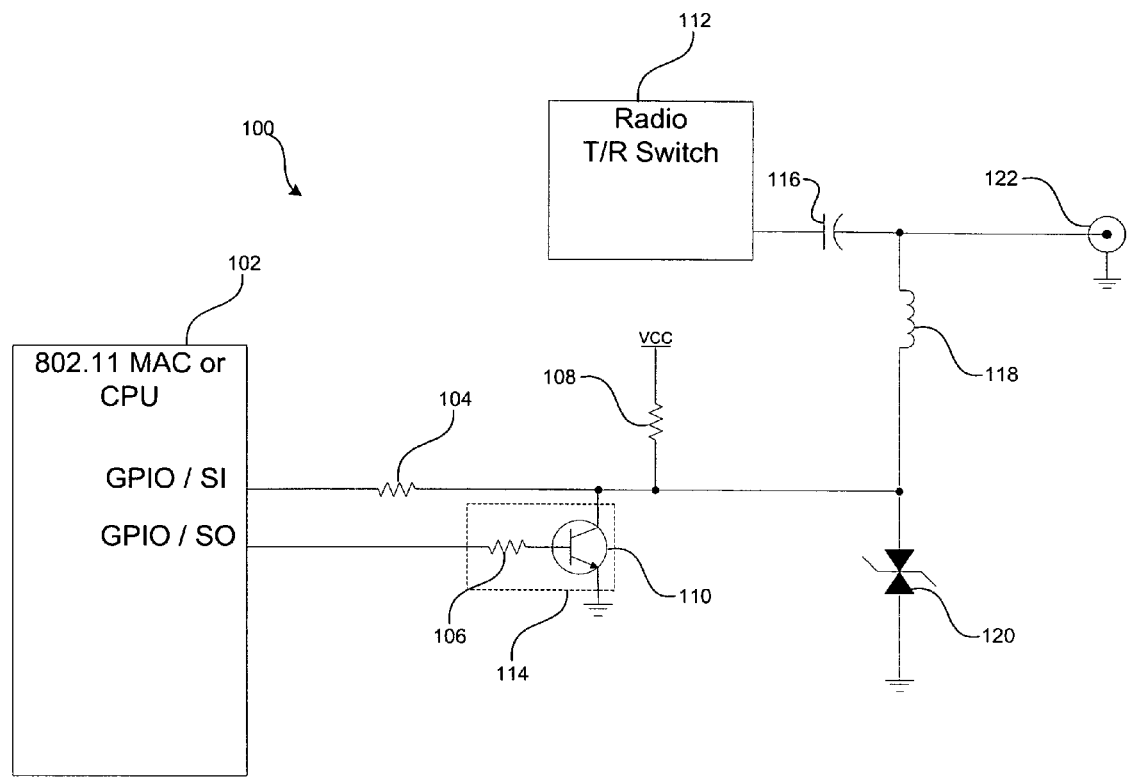
FIG. 5 is a schematic diagram of a transceiver in accordance with the present system.

Referring to FIG. 5, a schematic diagram of a transceiver in accordance with the present system is shown. Transceiver 100 comprises an 802.11 media access controller (MAC) or central processing unit (CPU) 102, resistors 104, 106, and 108, transistor 110, radio switch transmit/receive switch 112, capacitor 116, choke, coil, or inductor 118, transient voltage suppressor 120, and coaxial connector 122. Resistor 106 and transistor 110 comprise a reset circuit 110, and, along with resistors 104, 108, provide the ability to reset a microcontroller associated with an antenna assembly. An antenna assembly is coupled to coaxial connector 122 and selected using transmit/receive switch 112 coupled through capacitor 116. Inductor 118 provides high frequency isolation for 802.11 media access controller or central processing unit 102, while transient voltage suppressor 120 protects the 802.11 media access controller or central processing unit 120 from any energy strikes to an associated assembly coupled to coaxial connector 122.

In operation, transceiver 100 provides reset control external to an antenna assembly. Moreover, two-way communications are provide with an antenna assembly. Such communications allow 802.11 media access controller or central processing unit 102 to reset, write data to, and read data from a microprocessor associated with an antenna assembly as previously described.

Also as described hereinabove, the present invention solves many problems associated with previous type devices. Moreover, while the wireless local area network industry as a whole is moving toward wireless networks managed at a high level, the present invention allows higher level automatic configuration of a wireless network. This is especially important in instances where a wireless local area network includes access points having different antenna configurations. Automatically reporting antenna information as described herein lowers the network installation burden by eliminating manual entry of key network configuration information as commonly associated with previous systems. Further, use of the present invention lowers installation mistakes, and helps ensure a good network installation.

However, it will be appreciated that various changes in the details, materials and arrangements of parts which have been herein described and illustrated in order to explain the nature of the invention may be made by those skilled in the area within the principle and scope of the invention will be expressed in the appended claims.

What is claimed is:

1. A method of network management, comprising:
polling a first wireless access point of a plurality of wireless access points to acquire transmission characteristics; receiving transmission characteristics for the first wireless access point in response to the poll, the transmission characteristics comprising data representative of transmit power; receiving data representative of received signal strength of a signal sent from the first wireless access point received by a second of the plurality of wireless access points; determining a path loss based on the data representative of transmit power and data representative of signal strength; and varying the output power for the first of the plurality of access points based on the data representative of transmit power and path loss so as to establish a predetermined coverage area;
receiving transmission characteristics including data representative of transmit power for each of the plurality of access points; receiving data representative of received signal strength for each of the plurality of wireless access points; determining a path loss for each of the wireless access points based on data representative of transmit power and data representative of received signal strength; and adjusting the output power of each the plurality of wireless access points based on the data representative of transmit power and path loss to establish predetermined coverage areas.

2. The method of network management of claim 1, further comprising calculating path loss for each of the plurality of wireless access points based on antenna characteristics determined from the transmission characteristics.

3. The method of network management of claim 1, wherein the transmission characteristics include at least one of predetermined antenna gain, a measured output power, an operational frequency band, and an identifying characteristic of a respective antenna assembly.

4. The method of network management of claim 3, wherein the identifying characteristic is at least one of a product model number, a part number, a revision number, a serial number, and a manufacturing date.

5. The method of network management of claim 1, further comprising remotely detecting the transmission power of an antenna associated with the access point.

6. The method of network management of claim 1, further comprising selectively adjusting the output power of the access point to achieve a desired power level.

7. The method of network management of claim 1, further comprising detecting antenna orientation.

8. The method of network management of claim 1, wherein the transmission characteristics include antenna type and the antenna type is one of the group consisting of dipole, omni, patch, array, Yagi, and parabolic dish.

9. The method of network management of claim 1, further comprising selecting an operational band determined by reading a memory associated with an antenna assembly and updating the memory in accordance with the selection.

10. The method of network management of claim 9, wherein the operational band is one of the group consisting of 2.4 and 5 Gigahertz.

11. The method of network management of claim 1, further comprising at least one of reading an analog voltage and setting an analog voltage.

12. The method of network management of claim 1, further comprising shutting down the access point if a non-compliant antenna is detected.

13. The method of network management of claim 1, further comprising determining a minimum power level for the plurality of access points to provide adequate coverage.

14. A computer-readable medium having instructions stored thereon that, when executed by a processor, to instructions for managing a network, comprising:
means for polling a first wireless access point of a plurality of wireless access points to acquire transmission characteristics; means for receiving transmission characteristics for the first wireless access point in response to the poll, the transmission characteristics comprising data representative of transmit power; means for receiving data representative of received signal strength of a signal sent from the first wireless access point received by a second of the plurality of wireless access points; means for determining a path loss based on the data representative of transmit power and data representative of signal strength; and means for varying the output power for the first of the plurality of access points based on the data representative of transmit power and path loss so as to establish a predetermined coverage area for each of the plurality of access points means for receiving transmission characteristics including data representative of transmit power for each of the plurality of access points; receiving data representative of received signal strength for each of the plurality of wireless access points; means for determining a path loss for each of the wireless access points based on data representative of transmit power and data representative of received signal strength; and means for adjusting the output power of each the plurality of wireless access points based on the data representative of transmit power and path loss to establish predetermined coverage areas.

15. The computer-readable medium of instructions for managing a network of claim 14, further comprising means for calculating path loss for each of the plurality of wireless access points based on antenna characteristics determined from the transmission characteristics.

16. The computer-readable medium of instructions for managing a network of claim 14, wherein the transmission characteristics include at least one of predetermined antenna gain, a measured output power, an operational frequency band, and an identifying characteristic of a respective antenna assembly.

17. The computer-readable medium of instructions for managing a network of claim 16, wherein the identifying characteristic is at least one of a product model number, a part number, a revision number, a serial number, and a manufacturing date.

18. The computer-readable medium of instructions for managing a network of claim 14, further comprising means for remotely detecting the transmission power of an antenna associated with the access point.

19. The computer-readable medium of instructions for managing a network of claim 14, further comprising means for selectively adjusting the output power of the access point to achieve a desired power level.

20. The computer-readable medium of instructions for managing a network of claim 14, further comprising means for detecting antenna orientation.

21. The computer-readable medium of instructions for managing a network of claim 14, wherein the transmission characteristics include antenna type and the antenna type is one of the group consisting of dipole, omni, patch, array, Yagi, and parabolic dish.

22. The computer-readable medium of instructions for managing a network of claim 14, further comprising means for selecting an operational band determined by reading a memory associated with an antenna assembly and means for updating the memory in accordance with the selection.

23. The computer-readable medium of instructions for managing a network of claim 22, wherein the operational band is one of the group consisting of 2.4 and 5 Gigahertz.

24. The computer-readable medium of instructions for managing a network of claim 14, further comprising means for at least one of reading an analog voltage and setting an analog voltage.

25. An apparatus, comprising:

a network manager operable to communicate with a plurality of wireless access points; the network manager is operable to poll a first wireless access point of the plurality of wireless access points to acquire transmission characteristics, the first wireless access point having a coverage area; the network manager is operable to receive transmission characteristics for the first wireless access point in response to the poll, the transmission characteristics comprising data representative of transmit power; the network manager is operable to receive data representative of received signal strength of a signal sent from the first wireless access point received by a second of the plurality of wireless access points; the network manager is operable to determine a path loss based on the data representative of transmit power and data representative of signal strength; and the network manager is operable to vary the output power for the first of the plurality of access points based on the data representative of transmit power and path loss so that the first wireless access point has a suitable amount of power to establish the coverage area the network manager is configured to receive transmission characteristics including data representative of transmit power for each of the plurality of access points, wherein each of the plurality of wireless access points has a corresponding coverage area; the network manager is configured to receive data representative of received signal strength for each of the plurality of wireless access points; the network manager is operable to determine a oath loss for each of the wireless access points based on data representative of transmit power and data representative of received signal strength; and the network manager is operable to adjust the output power of each the plurality of wireless access points based on the data representative of transmit power and oath loss to establish the corresponding coverage areas for each of the wireless access points.

* * * * *